(12) United States Patent
Zheng et al.

(10) Patent No.: US 7,948,314 B2
(45) Date of Patent: May 24, 2011

(54) TUNABLE LINEAR OPERATIONAL TRANSCONDUCTANCE AMPLIFIER

(75) Inventors: Kunkun Zheng, Shanghai (CN); Jianhua Zhao, Shanghai (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 0 days.

(21) Appl. No.: 12/473,131

(22) Filed: May 27, 2009

(65) Prior Publication Data
US 2009/0322428 A1 Dec. 31, 2009

(30) Foreign Application Priority Data

Jun. 27, 2008 (CN) .......................... 2008 1 0130712

(51) Int. Cl.
*H03F 3/45* (2006.01)
(52) U.S. Cl. ....................................... 330/253; 330/257

(58) Field of Classification Search ........... 330/252–261
See application file for complete search history.

(56) References Cited

U.S. PATENT DOCUMENTS

| | | | | |
|---|---|---|---|---|
| 6,346,856 B1 * | 2/2002 | Myers et al. | .................. | 330/252 |
| 6,549,074 B2 * | 4/2003 | Ugajin et al. | .................. | 330/258 |
| 6,704,560 B1 * | 3/2004 | Balteanu et al. | ............... | 455/333 |

\* cited by examiner

*Primary Examiner* — Hieu P Nguyen
(74) *Attorney, Agent, or Firm* — Lisa K. Jorgenson; Andre M. Szuwalski

(57) ABSTRACT

A tunable, linear operational transconductance amplifier includes a differential voltage to current conversion unit adapted to generate first and second output signals at respective first and second output nodes responsive to first and second differential input signals. A first current amplification unit is adapted to generate a third output signal responsive to the first output signal and first and second control signals. A second current amplification unit is adapted to generate a fourth output signal responsive to the second output signal and the first and second control signals.

22 Claims, 2 Drawing Sheets

TUNABLE LINEAR OPERATIONAL TRANSCONDUCTANCE AMPLIFIER

CROSS-REFERENCE TO RELATED APPLICATION

This application is a translation of, and claims priority from, Chinese Application for Patent No. 200810130712.X, filed Jun. 27, 2008, the disclosure of which is hereby incorporated by reference for all purposes.

FIELD OF THE INVENTION

The invention relates to an operational transconductance amplifier (OTA), and particularly to a tunable linear OTA.

BACKGROUND

An OTA produces an output current responsive to a differential input voltage. A conventional OTA 100 is shown in FIG. 1. The OTA 100 includes a voltage to current converter 104 comprising OpAmps 108 and 112, CMOS transistors 116 and 120, and a coupling resistor 124. The OpAmp 108 includes a non-inverting terminal 109 to which is applied a voltage $V_{in+}$. The OpAmp 108 includes an output terminal 110 to which is coupled a gate terminal 117 of the transistor 116. An inverting terminal 111 of the OpAmp 108 is coupled to a source terminal 118 of the transistor 116.

The OpAmp 112 includes a non-inverting terminal 113 to which is applied a voltage $V_{in-}$. The OpAmp 112 includes an output terminal 114 to which is coupled a gate terminal 121 of the transistor 120. An inverting terminal 115 of the OpAmp 112 is coupled to a source terminal 122 of the transistor 120.

Responsive to a difference measurement ($V_{in+}-V_{in-}$), with $V_{in+}$ and $V_{in-}$ being applied to the non-inverting terminal 109 and 113 of the respective OpAmps 108 and 112, the voltage to current converter 104 generates currents $I_{i+}$ and $I_{i-}$. A first current mirror 128 includes CMOS transistors 136 and 140. The transistor 136 includes a gate terminal 137 to which is coupled a gate terminal 141 of the transistor 140. The transistor 140 includes a drain terminal 142 to which is coupled the gate terminal 141. The transistor 137 includes a drain terminal 138 coupled to a first output terminal. The transistor 136 includes a source terminal 139 to which is coupled a source terminal 143 of the transistor 140. The current mirror 128 amplifies the current $I_{i+}$ to generate a current $I_{o+}$.

A second current mirror 132 includes CMOS transistors 144 and 148. The transistor 144 includes a gate terminal 145 to which is coupled a gate terminal 149 of the transistor 148. The transistor 144 includes a drain terminal 146 to which is coupled the gate terminal 145. The transistor 148 includes a drain terminal 150 coupled to a second output terminal. The transistor 144 includes a source terminal 147 to which is coupled a source terminal 151 of the transistor 148. The current mirror 132 amplifies the current $I_{i-}$ to generate a current $I_{o-}$.

The transconductance $G_m$ of the OTA 100 is represented by the following equation:

$$G_m = 1/R_g, \text{ where } R_g \text{ is the value of the resistor 124} \quad (1)$$

It will be appreciated that the transconductance $G_m$ of the OTA 100 is linear because $G_m$ is determined solely by $R_g$. However, since $R_g$ is constant, the transconductance $G_m$ is not easily adjustable.

Another conventional OTA 200 is shown in FIG. 2. The OTA 200 is similar in all respects to the OTA 100 (shown in FIG. 1) except that the coupling resistor 124 is replaced by coupling transistors 204 and 208. The source terminals 225 and 226 of the respective transistors 204 and 208 are coupled to the source terminal 118 of the transistor 116. The drain terminals 227 and 228 of the respective transistors 204 and 208 are coupled to the source terminal 122 of the transistor 120. A voltage $V_T$ is applied to gate terminals 212 and 216 of the respective transistors 204 and 208.

The transconductance $G_m$ of the OTA 200 is determined by the on-resistance value of the coupling transistors 204 and 208. Since the on-resistance of the coupling transistors 204 and 208 may be adjusted by the voltage $V_T$ applied to the respective gate terminals 212 and 216 of the transistors 204 and 208, the transconductance $G_m$ may be adjusted (i.e., $G_m$ is tunable). However, the on-resistance of the coupling transistors 204 and 208 also varies non-linearly depending on $V_T$, thereby introducing non-linearity in $G_m$ and decreasing the accuracy of $G_m$.

SUMMARY

A tunable, linear operational transconductance amplifier includes a differential voltage to current conversion unit adapted to generate first and second output signals at respective first and second output nodes responsive to first and second differential input signals. A first current amplification unit is adapted to generate a third output signal responsive to the first output signal and first and second control signals. A second current amplification unit is adapted to generate a fourth output signal responsive to the second output signal and the first and second control signals.

The differential voltage to current conversion unit includes first and second operational amplifiers each having a respective non-inverting input terminal to which one of the respective first and second differential input signals is applied. A first transistor is coupled to the first operational amplifier and is adapted to generate the first output signal at the first output node. A second transistor is coupled to the second operational amplifier and is adapted to generate the second output signal at the second output node. A resistor is connected between the first and second output nodes.

The first current amplification unit includes third and fourth operational amplifiers each having a respective non-inverting input terminal to which the respective third and fourth differential input signals is applied. The first current amplification unit further includes third and fourth transistors each having a respective gate terminal coupled to an output terminal of the respective third and fourth operational amplifiers. The first current amplification unit further includes a first current mirror circuit coupled between the third and fourth transistors.

The second current amplification unit includes fifth and sixth operational amplifiers each having a respective non-inverting input terminal to which the respective third and fourth differential input signals is applied. The second current amplification unit includes seventh and eighth transistors each having a respective gate terminal coupled to an output terminal of the respective fifth and sixth operational amplifiers. The second current amplification unit further includes a second current mirror circuit coupled between the seventh and eighth transistors.

BRIEF DESCRIPTION OF THE DRAWINGS

For a more complete understanding of the features, example embodiments and possible advantages of the present invention, reference is now made to the detailed description of the invention along with the accompanying figures and in which.

DETAILED DESCRIPTION OF THE DRAWINGS

Figures 1, 2:
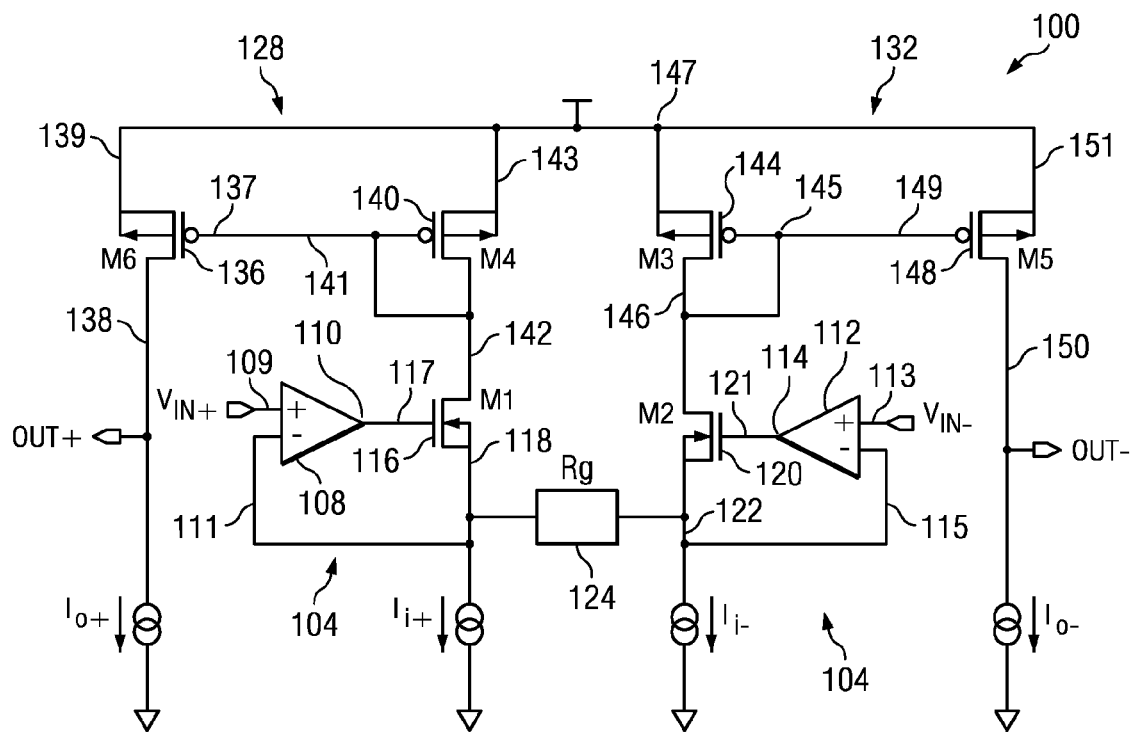
FIGS. 1 and 2 illustrate conventional OTAs.
Figure 3:
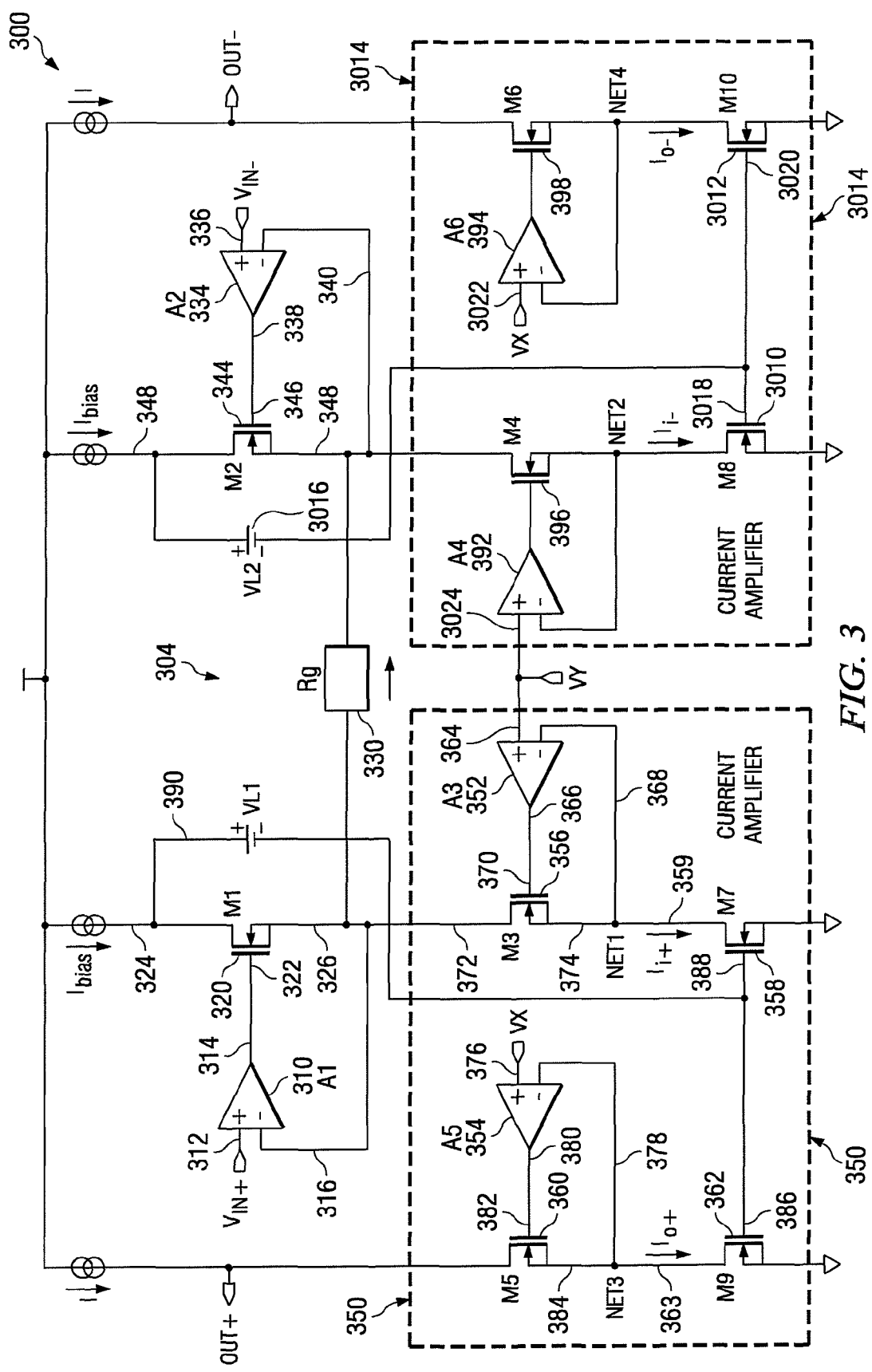
FIG. 3 illustrates a tunable, linear OTA in accordance with one example implementation.

FIG. 3 illustrates a tunable, linear OTA 300 in accordance with one example implementation. The OTA 300 includes a voltage to current converter 304 having OpAmps 310 and 334, CMOS transistors 320 and 344, and a coupling resistor 330.

The transistors 320 and 344 each receive a current $I_{bias}$ at respective drain terminals 324 and 348. The OpAmp 310 includes a non-inverting input terminal 312 to which is applied a differential input voltage $V_{in+}$. The transistor 320 includes a gate terminal 322 to which an output terminal 314 of the OpAmp 310 is coupled. The OpAmp 310 includes an inverting terminal 316 to which a source terminal 326 of the transistor 320 is coupled.

Similarly, a differential input voltage $V_{in-}$ is applied to a non-inverting input terminal 336 of the OpAmp 334. The OpAmp 334 includes an output terminal 338 to which a gate terminal 346 of the transistor 344 is coupled. The OpAmp 334 includes an inverting terminal 340 to which is coupled a source terminal 348 of the transistor 344. The resistor 330 is coupled between the source terminals 326 and 348 of the respective transistors 320 and 344. Responsive to a difference measurement ($V_{in+}-V_{in-}$), with $V_{in+}$ and $V_{in-}$ being applied to respective non-inverting input terminals 312 and 336 of the OpAmps 310 and 334, the voltage to current converter 304 generates currents $I_{i+}$ and $I_{i-}$.

A current amplifier 350 (indicated by broken lines) amplifies the current $I_{i+}$ to generate a current $I_{o+}$. The current amplifier 350 includes OpAmps 352 and 354, and CMOS transistors 356, 358, 360 and 362. The transistors 358 and 362 are configured as a current mirror, with the OpAmps 352 and 354 controlling the transistors 356 and 360, respectively.

The OpAmp 352 includes a non-inverting terminal 364 to which is applied a first control voltage $V_Y$. The OpAmp 352 includes an output terminal 366 to which is coupled a gate terminal 370 of the transistor 356. The OpAmp 352 includes an inverting terminal 368 to which is coupled a source terminal 374 of the transistor 356 and a drain terminal 359 of the transistor 358.

The OpAmp 354 includes a non-inverting terminal 376 to which is applied a second control voltage $V_X$. The OpAmp 354's output terminal 380 is coupled to a gate terminal 382 of the transistor 360. The OpAmp 354 includes an inverting terminal 378 to which is coupled a source terminal 384 of the transistor 360 and a drain terminal 363 of the transistor 362.

The gate terminal 386 and 388 of the respective transistors 362 and 358 are coupled, thus forming a current mirror. A voltage level shifter 390 is connected between a source terminal 324 of the transistor 320 and the gate terminals 388 and 386. The voltage level shifter 390 applies a gate voltage to the transistors 358 and 362, which operate in the triode or linear region.

Another current amplifier 3014 (indicated by broken lines) includes OpAmps 392 and 394, and CMOS transistors 396, 398, 3010 and 3012. The transistors 3010 and 3012 are configured as a current mirror, with the OpAmps 392 and 394 controlling the respective transistors 396 and 398. A voltage level shifter 3016 provides the gate voltage to gate terminals 3018 and 3020 of the respective transistors 3010 and 3012.

The configuration of the current amplifier 3014 is similar to that of the current amplifier 350.

The OpAmp 394 includes a non-inverting terminal 3022 to which is applied the second control voltage $V_X$, and the OpAmp 392 includes a non-inverting terminal 3024 to which is applied the first control voltage $V_Y$. As will be appreciated, responsive to a difference measurement ($V_X-V_Y$), the current amplifiers 350 and 3014 amplify $I_{i+}$ and $I_{i-}$ to generate $I_{o+}$ and $I_{o-}$, respectively. Thus, the voltage difference ($V_X-V_Y$) is used to adjust or tune the output of the OTA 300.

The OTA 300 exhibits a linear response due to the presence of the resistor 330 in the voltage to current converter 304. Also, responsive to the voltage difference ($V_X-V_Y$), the OpAmps 352 and 354 modulate the gain of the current amplifier 350 and the OpAmps 392 and 394 modulate the gain of the current amplifier 3014, thus allowing the gain of the OTA 300 to be easily tuned.

The current gain $A_i$ may be represented by the following equation:

$$A_i = I_{o+}/I_{i+} = I_{o-}/I_{i-} = V_X/V_Y \qquad (2)$$

The transconductance $G_m$ of the OTA 300 may be represented by the following equation:

$$G_m = 2*(V_X/V_Y)(1/R_g) = K*(V_X/V_Y); \text{ where } K \text{ is a constant} \qquad (3)$$

It will be appreciated from equation (3), the transconductance $G_m$ of the OTA 300 can be tuned by varying the control voltages $V_X$ and $V_Y$. Also, $G_m$ is linear since K is constant.

In one example implementation, $R_g$=16K Ohm and $I_{bias}$=200 uA. Based on one example implementation, the calculated tuning range of $G_m$ and the total harmonic distortion as a function of the control voltages $V_X$ and $V_Y$ are listed in Table 1 below.

TABLE 1

| $V_Y$ | $V_X$ | Gm (S) | THD (%) |
|---|---|---|---|
| 100 m | 10 m | 21.09 u | 18.77 m |
| 100 m | 20 m | 31.57 u | 19.53 m |
| 100 m | 30 m | 42.47 u | 20.04 m |
| 100 m | 40 m | 53.72 u | 20.47 m |
| 100 m | 50 m | 65.24 u | 21.00 m |
| 100 m | 60 m | 76.94 u | 21.60 m |
| 100 m | 70 m | 88.76 u | 22.29 m |
| 100 m | 80 m | 100.6 u | 23.04 m |
| 100 m | 90 m | 112.6 u | 24.00 m |
| 100 m | 100 m | 124.5 u | 25.09 m |
| 100 m | 110 m | 136.4 u | 26.40 m |
| 100 m | 120 m | 148.4 u | 27.95 m |
| 100 m | 130 m | 160.3 u | 29.80 m |
| 100 m | 140 m | 172.1 u | 31.96 m |
| 100 m | 150 m | 183.9 u | 34.55 m |
| 100 m | 160 m | 195.7 u | 37.73 m |
| 100 m | 170 m | 207.3 u | 41.72 m |
| 100 m | 180 m | 218.9 u | 46.74 m |
| 100 m | 190 m | 230.4 u | 52.88 m |

It will be appreciated from Table 1 that the transconductance $G_m$ of the OTA 300 is highly linear. As $V_X$ varies from 70 mV to 140 mV, $$\frac{d(Gm)}{d(VX)}$$

varies less than 1%.

It will also be appreciated that one or more of the elements depicted in the drawings/figures can also be implemented in a more separated or integrated manner, or even removed or rendered as inoperable in certain cases, as is useful in accordance with a particular application.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A tunable, linear operational transconductance amplifier, comprising:
    a differential voltage to current conversion unit adapted to generate first and second current signals at respective first and second nodes responsive to first and second differential input signals, wherein the differential voltage to current conversion unit includes first and second operational amplifiers each having a first input terminal adapted to receive the first and second differential input signals, respectively, and each having a second input terminal coupled to the first and second nodes, respectively;
    a resistor coupled between the first and second nodes;
    a first current amplification unit adapted to generate a first output signal responsive to the first current signal and first and second control signals; and
    a second current amplification unit adapted to generate a second output signal responsive to the second current signal and the first and second control signals.

2. The operational transconductance amplifier as recited in claim 1, wherein the differential voltage to current conversion unit further includes:
    a first transistor coupled to an output of the first operational amplifier and adapted to generate the first current signal at the first node; and
    a second transistor coupled to an output of the second operational amplifier and adapted to generate the second current signal at the second node.

3. The operational transconductance amplifier as recited in claim 1, wherein the first current amplification unit includes:
    third and fourth operational amplifiers each having a respective input terminal adapted to receive the respective first and second control signals;
    third and fourth transistors each having a respective gate terminal coupled to an output terminal of the respective third and fourth operational amplifiers; and
    a current mirror circuit coupled between the third and fourth transistors.

4. The operational transconductance amplifier as recited in claim 3, wherein the current mirror circuit comprises fifth and sixth transistors each having a respective drain terminal coupled to a respective source terminal of the third and fourth transistors.

5. The operational transconductance amplifier as recited in claim 4, wherein a gate terminal of the fifth transistor is coupled to a gate terminal of the sixth transistor.

6. The operational transconductance amplifier as recited in claim 3, wherein the third and fourth operational amplifiers each have a respective inverting terminal coupled to the drain terminal of the respective fifth and sixth transistors.

7. The operational transconductance amplifier as recited in claim 4, further comprising a first voltage level shifter coupled to the gate terminals of the fifth and sixth transistors and adapted to apply a gate voltage.

8. The operational transconductance amplifier as recited in claim 1, wherein the second current amplification unit includes:
    fifth and sixth operational amplifiers each having a respective non-inverting input terminal adapted to receive the respective first and second control signals;
    seventh and eighth transistors each having a respective gate terminal coupled to an output terminal of the respective fifth and sixth operational amplifiers; and
    a current mirror circuit coupled between the seventh and eighth transistors.

9. The operational transconductance amplifier as recited in claim 8, wherein the current mirror circuit comprises ninth and tenth transistors each having a respective drain terminal coupled to a source terminal of the respective seventh and eighth transistors.

10. The operational transconductance amplifier as recited in claim 9, wherein a gate terminal of the ninth transistor is coupled to a gate terminal of the tenth transistor.

11. The operational transconductance amplifier as recited in claim 8, wherein the fifth and sixth operational amplifiers each have a respective inverting terminal coupled to the drain terminal of the respective ninth and tenth transistors.

12. The operational transconductance amplifier as recited in claim 8, further comprising a second voltage level shifter coupled to the gate terminals of the ninth and tenth transistors and adapted to apply a gate voltage.

13. The operational transconductance amplifier as recited in claim 1, wherein a transconductance of the amplifier is controlled by the voltage levels of the first and second control signals.

14. A tunable operational transconductance amplifier, comprising:
    a differential voltage to current conversion unit adapted to generate first and second output signals at respective first and second output nodes responsive to first and second differential input signals;
    a first current amplification unit adapted to generate a third output signal responsive to the first output signal and first and second control signals; and a second current amplification unit adapted to generate a fourth output signal responsive to the second output signal and the first and second control signals;

wherein a transconductance of the amplifier is represented by the following equation:

$$Gm = K^*(V_X/V_Y),$$

where Gm is the transconductance, K is a constant, and $V_X$ and $V_Y$ are the first and second control signals, respectively.

15. The operational transconductance amplifier as recited in claim 14, wherein the amplifier is implemented as a semiconductor integrated circuit.

16. A tunable operational transconductance amplifier, comprising:
   a first operational amplifier having an input terminal adapted to receive a first differential input signal;
   a second operational amplifier having an input terminal adapted to receive a second differential input signal;
   a first transistor coupled to the first operational amplifier and adapted to generate a first output signal at a first output node;
   a second transistor coupled to the second operational amplifier and adapted to generate a second output signal at a second output node;
   a resistor coupled between the first and second output nodes;
   a first current amplifier adapted to generate a third output signal responsive to the first output signal and first and second control signals; and
   a second current amplifier adapted to generate a fourth output signal responsive to the second output signal and the first and second control signals.

17. The operational transconductance amplifier as recited in claim 16, wherein a transconductance of the amplifier is represented by the following equation:

$$Gm = K^*(V_X/V_Y),$$

where Gm is the transconductance, K is a constant, and $V_X$ and $V_Y$ are voltages of the first and second control signals, respectively.

18. The operational transconductance amplifier as recited in claim 16, wherein the first current amplifier includes:
   third and fourth operational amplifiers each having a respective input terminal adapted to receive the respective first and second control signals;
   third and fourth transistors each having a respective gate terminal coupled to an output terminal of the respective third and fourth operational amplifiers; and
   a first current mirror circuit coupled between the third and fourth transistors.

19. The operational transconductance amplifier as recited in claim 16, wherein the second current amplifier includes:
   fifth and sixth operational amplifiers each having a respective input terminal adapted to receive the respective first and second control signals;
   fifth and sixth transistors each having a respective gate terminal coupled to an output terminal of the respective fifth and sixth operational amplifiers; and
   a second current mirror circuit coupled between the seventh and eighth transistors.

20. A tunable operational transconductance amplifier, comprising:
   a voltage to current converter adapted to receive a differential input voltage and output at first and second nodes first and second currents responsive thereto;
   a resistor coupled between the first and second nodes;
   a first circuit adapted to receive the first current at the first node and output a third current amplified in response to first and second control voltages, the first circuit comprising a first current mirror circuit having a first leg including a voltage to current converter receiving the first control voltage and a second leg mirrored to the first leg and including a voltage to current converter receiving the second control voltage; and
   a second circuit adapted to receive the second current at the second node and output a fourth current amplified in response to the first and second control voltages, the second circuit comprising a second current mirror circuit having a first leg including a voltage to current converter receiving the first control voltage and a second leg mirrored to the first leg and including a voltage to current converter receiving the second control voltage.

21. A tunable operational transconductance amplifier, comprising:
   a voltage to current converter adapted to receive a differential input voltage and output first and second currents responsive thereto;
   a first circuit adapted to receive the first current and output a third current amplified in response to first and second control voltages; and
   a second circuit adapted to receive the second current and output a fourth current amplified in response to the first and second control voltages;
   wherein a ratio of the third current to the first current, and a ratio of the fourth current to the second current, is given by a ratio of the first voltage to the second voltage.

22. A tunable operational transconductance amplifier, comprising:
   a voltage to current converter adapted to receive a differential input voltage and output first and second currents responsive thereto;
   a first circuit adapted to receive the first current and output a third current amplified in response to first and second control voltages; and
   a second circuit adapted to receive the second current and output a fourth current amplified in response to the first and second control voltages;
   wherein the voltage to current converter includes a transconductance resistor and wherein a transconductance of the amplifier is defined by $K^*(V_X/V_Y)$, where K is a constant, and $V_X$ and $V_Y$ are first and second control voltages, respectively.

* * * * *